(12) United States Patent
Kiep et al.

(10) Patent No.: US 9,513,318 B2
(45) Date of Patent: Dec. 6, 2016

(54) CURRENT OR VOLTAGE SENSING

(71) Applicant: Infineon Technologies AG, Neubiberg (DE)

(72) Inventors: Andreas Kiep, Munich (DE); Stefan Willkofer, Munich (DE)

(73) Assignee: Infineon Technologies AG, Neubiberg (DE)

( * ) Notice: Subject to any disclaimer, the term of this patent is extended or adjusted under 35 U.S.C. 154(b) by 224 days.

(21) Appl. No.: 14/290,668

(22) Filed: May 29, 2014

(65) Prior Publication Data

US 2015/0346245 A1    Dec. 3, 2015

(51) Int. Cl.
| | |
|---|---|
| *G01R 19/165* | (2006.01) |
| *H02M 1/08* | (2006.01) |
| *H02M 3/158* | (2006.01) |
| *H03K 17/082* | (2006.01) |
| *H03K 17/14* | (2006.01) |
| *H02M 1/00* | (2006.01) |

(52) U.S. Cl.
CPC .......... *G01R 19/16504* (2013.01); *H02M 1/08* (2013.01); *H02M 3/158* (2013.01); *H03K 17/082* (2013.01); *H03K 17/14* (2013.01); *H02M 2001/0009* (2013.01); *H03K 2217/0027* (2013.01)

(58) Field of Classification Search
CPC . G01R 19/00; G01R 19/0084; G01R 19/0082; G01R 19/16504; H02M 1/08; H02M 3/158; H02M 2001/0009
USPC .............. 324/76.11, 522, 713; 702/1, 57, 64
See application file for complete search history.

(56) References Cited

U.S. PATENT DOCUMENTS

| | | | | |
|---|---|---|---|---|
| 4,325,225 A * | 4/1982 | Price, II | ............... | B60H 1/3208 236/78 D |
| 4,706,009 A * | 11/1987 | Schwarz | ................. | H02J 7/022 320/138 |
| 6,246,220 B1 * | 6/2001 | Isham | ................. | H02M 3/1588 323/224 |
| 6,700,365 B2 * | 3/2004 | Isham | ................... | H02M 3/156 323/283 |
| 6,765,372 B2 * | 7/2004 | Isham | ................... | G01R 31/40 323/224 |
| 7,408,134 B1 * | 8/2008 | Shaw | ....................... | G01D 1/18 219/492 |

OTHER PUBLICATIONS

U.S. Appl. No. 14/290,683, filed May 29, 2014.

* cited by examiner

*Primary Examiner* — Hoai-An D Nguyen
(74) *Attorney, Agent, or Firm* — Shumaker & Sieffert, P.A.

(57) ABSTRACT

An example relates to a circuit comprising an electronic switching element and an temperature compensating element, which is arranged in the vicinity of the electronic switching element.

19 Claims, 5 Drawing Sheets

CURRENT OR VOLTAGE SENSING

BACKGROUND

Embodiments of the present disclosure relate to current or voltage sensing, in particular an improved sensing over a wide range of temperature.

SUMMARY

A first embodiment relates to a circuit comprising an electronic switching element and an temperature compensating element, which is arranged in the vicinity of the electronic switching element.

A second embodiment relates to a method for sensing a current or a voltage comprising the steps:
  determining whether the voltage or the current reaches or exceeds a predetermined threshold via the circuit as described herein;
  conducting a predetermined action in case the voltage or current reached or exceeded the predetermined threshold.

A third embodiment relates to a circuit for voltage or current sensing comprising:
  an electronic switching element and a temperature compensating element, which is arranged in the vicinity of the electronic switching element,
  means for determining whether the voltage or the current reaches or exceeds a predetermined threshold based on a voltage or current sensed via the temperature compensating element,
  means for conducting a predetermined action in case the voltage or current reached or exceeded the predetermined threshold.

BRIEF DESCRIPTION OF THE DRAWINGS

Embodiments are shown and illustrated with reference to the drawings. The drawings serve to illustrate the basic principle, so that only aspects necessary for understanding the basic principle are illustrated. The drawings are not to scale. In the drawings the same reference characters denote like features.

DETAILED DESCRIPTION OF THE PREFERRED EMBODIMENTS

Figure 1:
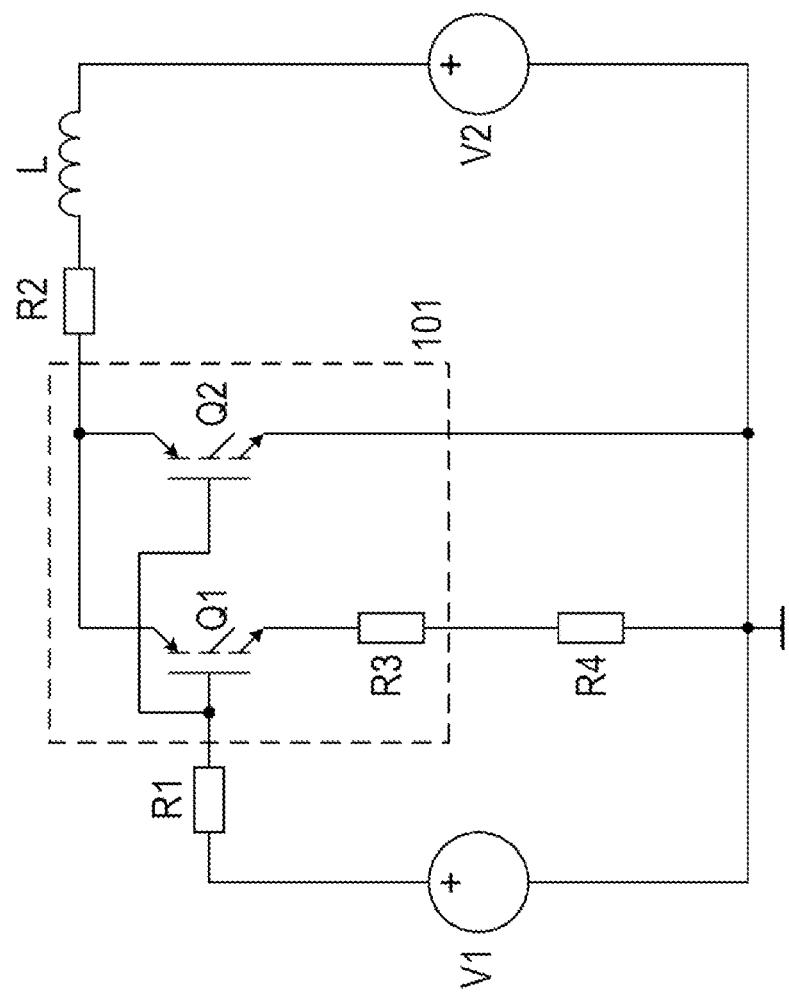
FIG. 1 shows an exemplary circuit diagram comprising two transistors that are combined with a resistor as temperature dependent device in a unit 101.

In many power electronic circuits (e.g., DC/AC inverters, DC/DC converters, etc.), a current needs to be measured. For example, the current information can be used for over-current protection, short circuit detection and/or any other control functions (e.g., current mode control).

In order to obtain such current information, a current sense field can be integrated inside a MOSFET, JFET or IGBT. The current sense field generates an electric current which is proportional to the load current, but smaller than the load current. The amount of the sense current may depend on the sense cell ratio (e.g., area ratio) and on the temperature. Such temperature dependency leads to a significant variation of the sense current, in particular in case the temperature of the MOSFET, JFET or IGBT is typically not known.

The current sensed may then be further processed to gain the actual current information, e.g., via means of sense resistors, operational amplifiers, Schmitt-triggers, etc.

The accuracy of the embedded current sense field varies over temperature. Especially in wide-temperature-range applications ranging from, e.g., −40° C. to 150° C., the accuracy changes may be significant, which may reduce the reliability and hence usability of such current sense mechanism for detection, protection, and/or control purposes.

For example, a short circuit detection circuit may typically be triggered at 420 A at a temperature of 150° C. compared to 550 A at a temperature of −40° C. Hence, the temperature shift may result in a current difference of 130 A. It is apparent that the short circuit current reaches 420 A sooner than it reaches 550 A. This translates into a longer short circuit pulse, a larger current amplitude, more power loss, and more short circuit energy, which may expose the transistor and the entire circuit to a significant amount of additional electrical and thermal stress due to the variation of temperature.

Examples provided herein in particular have an intrinsic temperature compensation of the sense current or sense voltage itself, preferably inside the semiconductor together with a current sense field. Hence, no additional compensation and no further complex signal processing is required.

The examples presented herein bear the advantage that a current can be sensed in short time, e.g., within microseconds, to allow for a fast (e.g., real-time) response. Such fast current sensing may be in particular advantageous for short circuit detection purposes. Also, the solution is efficient with regard to costs, required space and added power loss.

The solutions suggested herein can in particular be used for short circuit detection, overload protection and/or current mode control. Applications may be (but are not limited to) motor drives, air-conditioning compressors, pumps, etc. Such applications may be designed for significant temperature variations, e.g., in a range from 25° C. to 175° C.

According to an example, a temperature dependency of a transistor, e.g., IGBT or MOSFET may at least partially be compensated via an additional element, e.g., a resistor. This additional element may be embedded in the transistor and it may be exposed to substantially the same temperature as the transistor. The additional element may be connected in series with a current sensor (e.g., a current sense resistor).

This allows compensating or at least reducing a temperature dependency of the circuitry comprising the transistor. The additional element may be a temperature dependent device also referred to as temperature compensating element. Such temperature compensating element may at least partially compensate the current fluctuation that is based on temperature variations.

Exemplary Embodiment

Additional Element with Positive Temperature Coefficient

According to an example, the temperature dependent device may have a positive temperature coefficient, i.e. when the temperature increases a characteristics of the temperature dependent device increases as well. In case the temperature dependent device is a resistor, the resistance rises with an increase in temperature and the resistance falls with a decrease in temperature.

Preferably, the temperature dependent device, e.g., resistor with positive temperature coefficient, may be arranged in close proximity to the current sensor.

FIG. 1 shows an exemplary circuit diagram comprising two transistors Q1 and Q2 that are combined with a resistor R3 as temperature dependent device in a unit 101. The resistor R3 may have a positive temperature coefficient and it may be embedded with the transistors Q1 and Q2. The transistors Q1 and Q2 may be IGBTs or MOSFETs deployed on the same piece of silicon. The transistors Q1 and Q2 may share a functional unit that may be arranged on a common (e.g., emitter) area. The functional unit may comprise a multitude of functional elements that may be split according to a predetermined ratio, e.g., 1:10000. Hence, the transistor Q1 may act as the current sensor which carries a significantly smaller amount of current compared to the transistor Q2. The transistors Q1 and Q2 may be discrete transistors, wherein each of the transistor may have a split emitter pad or a split source pad. The transistors Q1 and Q2 may in particular be deployed on a single chip or die.

The functional unit may be based on a structure, in particular an area on the device. The area may comprise at least one of the following: a gate-source area, a base-emitter area, an IGBT cell, an IGBT stripe, etc. Also, combinations of the above may also be used as an area.

According to FIG. 1, the gate of the IGBT Q1 is connected with the gate of the IGBT Q2. The collectors of the IGBTs Q1 and Q2 are connected and are further connected to a load R2. The emitter of the IGBT Q1 is connected via a resistor R4 (sense resistor) to ground. The emitter of the IGBT Q2 is connected to ground. The gate of the IGBT Q1 is controlled via a voltage source V1 and a resistor R1 and the load R2 are further connected via an inductor L to a voltage source V2. The voltage sources V1 and V2 as well as the load R2 in combination with the inductor L are only exemplary elements of a circuitry in which the unit 101 can be used. The combination of the load R2 and the inductor L are also referred to as an R-L-load.

The resistor R3 may be realized as a temperature compensating element, which shows an increase in resistance with an increase in temperature. Hence, a voltage that can be determined at a node between the resistors R3 and R4, i.e. as voltage across the resistor R4, which is proportional to the current flowing through the current sense resistor R4, is substantially unbiased by variations of temperature.

The resistor R4 may in particular be deployed separately from the unit 101, in particular external to a chip that comprises the unit 101.

The resistor R3 may be integrated together with the IGBTs Q1 and Q2 in the unit 101. The temperature coefficient of the resistor R3 may be positive, substantially linear (corresponding in particular to the temperature coefficient of the voltage between the collector and the emitter of the IGBT Q1) and preferably large.

Advantageously, the temperature coefficient of the resistor may be at least +60% over 100K. For example, the resistor R3 may comprise, e.g., nickel (67% over 100K). It may have a resistance value in the range between 1 Ohm and 10 Ohm at a temperature of 25° C. The accuracy of the resistor R3 may be as high as possible, in particular better than 5%. The resistor R3 may also comprise, e.g., aluminum, doped poly-silicon, beryllium (100% over 100K), titanium, titanium-nitride, tungsten, titanium-tungsten, tantalum, tantalum-nitride and/or copper. It is noted that the resistor R3 may in particular comprise a material that can be used as a barrier layer.

When the IGBT's temperature increases, the collector-emitter saturation voltage $V_{CEsat}$ increases. When the MOSFET's temperature increases, the drain-source voltage increases due to an increasing resistance $R_{DSon}$.

This resistor R3 may carry the sense current (e.g., up to 100 mA). Hence, the resistor R3 may be adjusted accordingly. In addition, a current sense ratio may be adjusted, e.g., via functional units of the transistors Q1 and Q2 to reduce the sense current amount and to hence avoid any overload situation at the resistor R3. For example, the functional units of the transistors Q1 and Q2 may differ at a ratio of 1:10000 (with the transistor Q1 having the smaller amount of functional units) in order to allow for a small sense current compared to the current flowing through the load and the transistor Q2.

As an example, the resistor R3 may be implemented as a resistive element, e.g., a resistive layer on a chip. The resistive element may comprise aluminum, nickel, tungsten, iron etc. The resistive element is preferably in close proximity to the transistor Q1. The resistive element can be a locally concentrated element or somewhat distributed across the circuitry.

Figure 3:
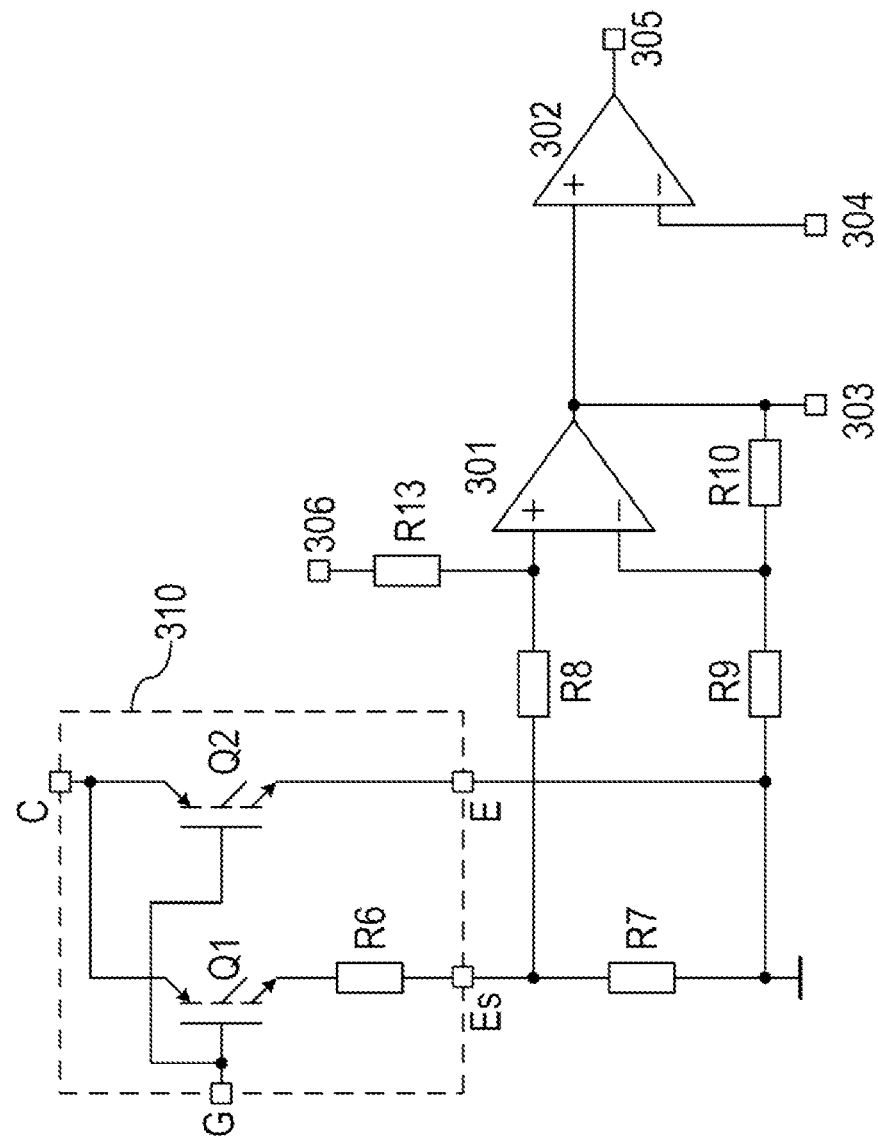
FIG. 3 shows a schematic diagram comprising a unit with two transistors and a resistor as a temperature dependent device with an attached circuitry to determine a temperature-compensated current or voltage and act accordingly.

FIG. 3 shows a schematic diagram comprising a unit 310 (which may be similar or identical to the unit 101 shown in FIG. 1) with two transistors Q1 and Q2 and a resistor R6 as a temperature dependent device. The resistor R6 may have a positive temperature coefficient and it may be embedded together with the transistors Q1 and Q2. The transistors Q1 and Q2 may be IGBTs or MOSFETs deployed on the same piece of silicon. The unit 310 comprises a gate terminal G that is connected to the gate of the transistor Q1 and to the gate of the transistor Q2, a collector terminal C that is connected to the collector of the transistor Q1 and to the collector of the transistor Q2, a sense emitter terminal Es that is connected via the resistor R6 to the emitter of the transistor Q1 and a emitter terminal E that is connected to the emitter of the transistor Q2.

The sense emitter terminal Es is connected via a resistor R7 to ground and via a resistor R8 to the non-inverting input of an operational amplifier 301. The non-inverting input of the operational amplifier 301 is connected via a resistor R13 to a node 306. The emitter terminal E is connected to ground. Also, the emitter terminal E is connected via a resistor R9 to the inverting input of the operational amplifier 301. The inverting input of the operational amplifier 301 and its output are connected via a resistor R10. The output of the operational amplifier 301 is connected to a node 303.

The output of the operational amplifier 301 is further connected to a first input of a comparator 302 (e.g., the non-inverting input of a second operational amplifier) and a node 304 is connected to the second input of the comparator 302 (e.g., the inverting input of the second operational amplifier). The output of the comparator 302 is connected to a node 305.

The nodes indicated in FIG. 3, e.g., nodes 303 to 306, may be realized as connection points, e.g., pins or terminals.

A voltage across the resistor R7 is proportional to the current supplied via the sense emitter terminal Es. A reference voltage may be provided at the node 306 and the node 303 may be connected to an analog-to-digital converter (ADC) or a microcontroller for further processing. The resistors R10 and R13 may be used as feedback resistors and the resistors R8 and R9 are input resistors for the operational amplifier 301.

An adjustable of a predetermined over-current threshold voltage may be applied via the node 304 to the comparator 302. The node 305 may be connected to an error logic or a microcontroller for further processing. Such further processing may comprise at least one of the following: setting a warning flag, increasing an error counter, turning off the transistor for which an over-current has been determined, turning off at least one additional transistor.

At the emitter terminal E, a load current in the range of 50 A to 500 A may be provided, whereas at the sense emitter terminal Es a faction of the load current, i.e. a sense current in the range from 1 mA to 100 mA may be provided. The fraction between these currents may amount to 1:1000 or 1:5000. It is noted that these figures are examples. Accordingly, different amounts of current and/or fractions may be utilized.

Figure 4:
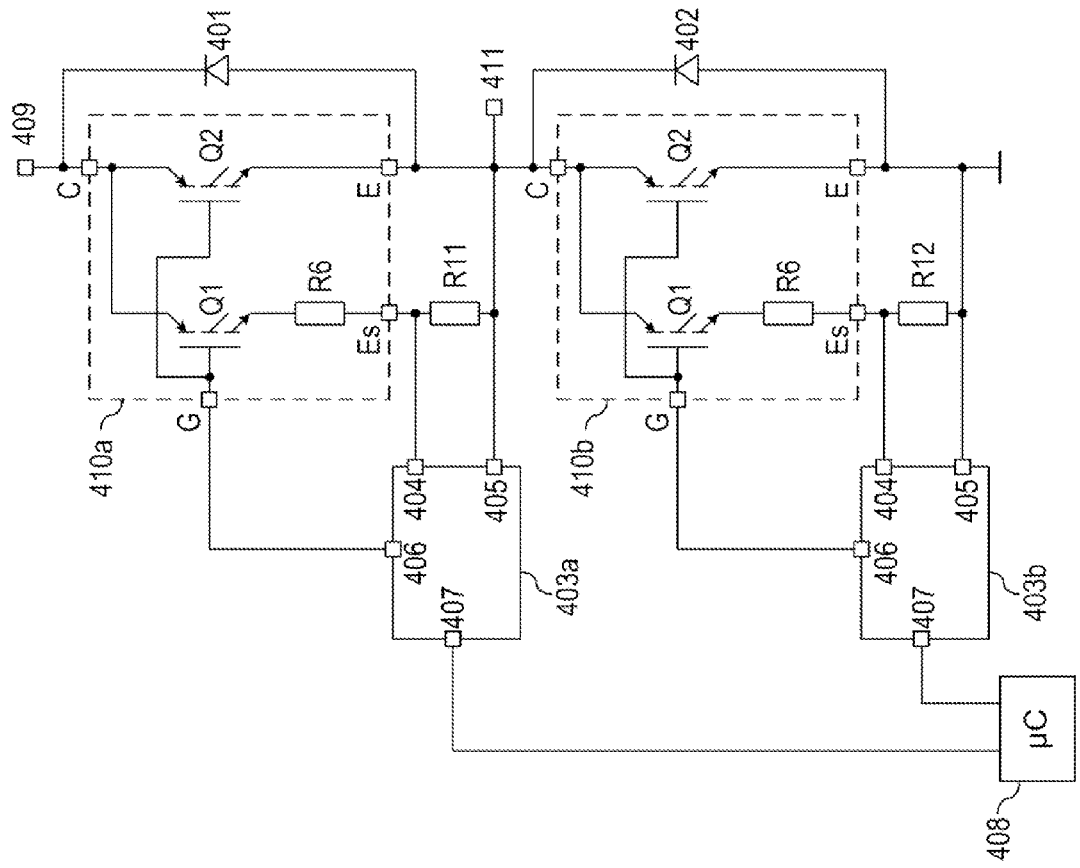
FIG. 4 shows a circuitry of an IGBT half-bridge arrangement comprising a high-side unit and a low-side unit, both units being controlled via a microcontroller in an isolated manner.

FIG. 4 shows a circuitry of an IGBT half-bridge arrangement comprising a high-side unit 410a and a low-side unit 410b. The units 410a and 410b may have the same structure as unit 310 shown in FIG. 3.

A node 409 is connected to the collector terminal C of the unit 410a, the emitter terminal E of the unit 410a is connected to the collector terminal C of the unit 410b and the emitter terminal E of the unit 410b is connected to ground. A high-side diode 401 is connected across the collector terminal C and the emitter terminal E of the unit 410a, wherein the cathode of the diode 401 is directed towards the collector terminal C. A low-side diode 402 is connected across the collector terminal C and the emitter terminal E of the unit 410b, wherein the cathode of the diode 402 is directed towards the collector terminal C.

FIG. 4 shows a high-side driver 403a and a low-side driver 403b, which may have the same structure. An exemplary implementation of the drivers 403a and 403b is shown in and explained in more detail with regard to FIG. 5. Each of the drivers 403a and 403b comprises terminals 404 to 407.

The gate terminal G of the unit 410a is connected to the terminal 406 of the driver 403a. The sense emitter terminal Es of the unit 410a is connected to the terminal 404 of the driver 403a. The emitter terminal E of the unit 410a is connected to the terminal 405 of the driver 403a. A resistor R11 (sense resistor) is connected between the terminals 404 and 405 of the driver 403a. The terminal 407 of the driver 403a is connected to a microcontroller 408. The gate terminal G of the unit 410b is connected to the terminal 406 of the driver 403b. The sense emitter terminal Es of the unit 410b is connected to the terminal 404 of the driver 403b. The emitter terminal E of the unit 410b is connected to the terminal 405 of the driver 403b. A resistor R12 (sense resistor) is connected between the terminals 404 and 405 of the driver 403b. The terminal 407 of the driver 403b is connected to the microcontroller 408.

A node 411 connected to the emitter terminal E of the unit 410a and to the collector terminal C of the unit 410b may be connected to a load, e.g., a single phase of a three phase generator.

Figure 5:
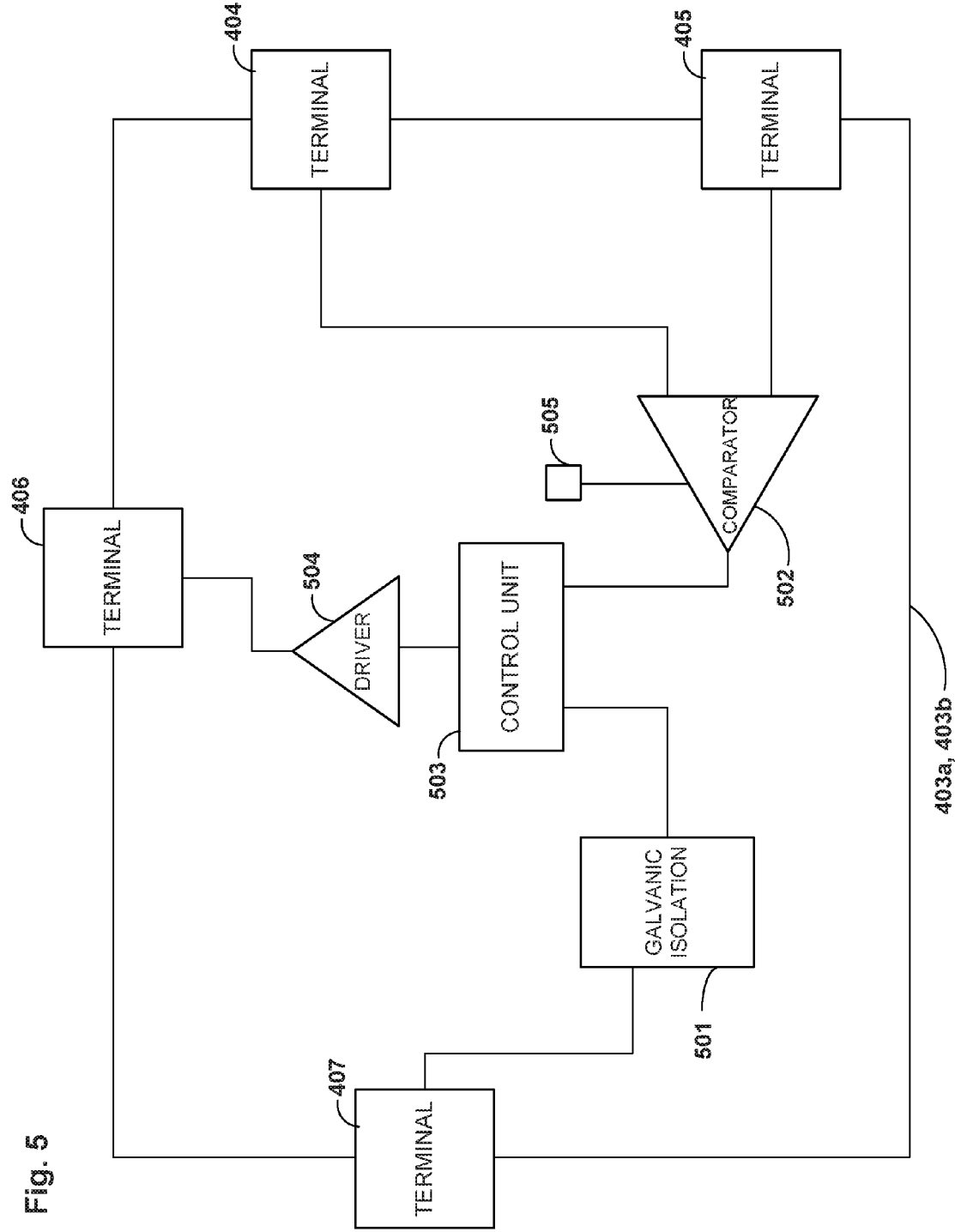
FIG. 5 shows a schematic diagram of the drivers employed in FIG. 4.

FIG. 5 shows a schematic of the driver 403a, 403b comprising the terminals 404 to 407. The terminal 404 is connected to the first input of a comparator 502 and the terminal 405 is connected to the second input of the comparator 502. Hence, a voltage sensed at the resistors R11 (in case of the driver 403a) and R12 (in case of the driver 403b) may be compared with an (adjustable or predetermined) over-current threshold voltage 505 and the result of such comparison is fed to a control unit 503.

The microcontroller 408 controls the driver 403a, 403b via its terminal 407, which is connected to the control unit 503 via a galvanic isolation 501. Such galvanic isolation 501 can be realized as an optocoupler, a transformer or any galvanically isolating element. It enables controlling the respective unit 410a, 410b by the microcontroller 408, wherein the microcontroller 408 in this example of FIG. 4 has ground as a reference potential and the gate terminals G of the units 410a, 410b may have different (floating) reference potentials (other than ground).

The control unit 503 provides an output signal via a driver 504 to the terminal 406, which is connected to the gate terminals of the units 410a and 410b.

The node 409 may be connected to a high DC voltage, e.g., 400V. As an alternative to the example shown in FIG. 4, a MOSFET half-bridge could be used for a DC/DC converter using lower input voltages, e.g., 14V. In such scenario, the gates of the transistors may be operated via a single driver and/or microcontroller. No galvanic separation of high-side switch and low-side switch is required.

Exemplary Embodiment

Additional Element with Negative Temperature Coefficient

According to an example, the temperature dependent device may have a negative temperature coefficient, i.e. when the temperature increases a characteristics of the temperature dependent device decreases. In case the temperature dependent device is a resistor, the resistance rises with a decrease in temperature and the resistance falls with an increase in temperature.

Preferably, the temperature dependent device, e.g., resistor with negative temperature coefficient, may be arranged in close proximity with the current sensor.

Figure 2:
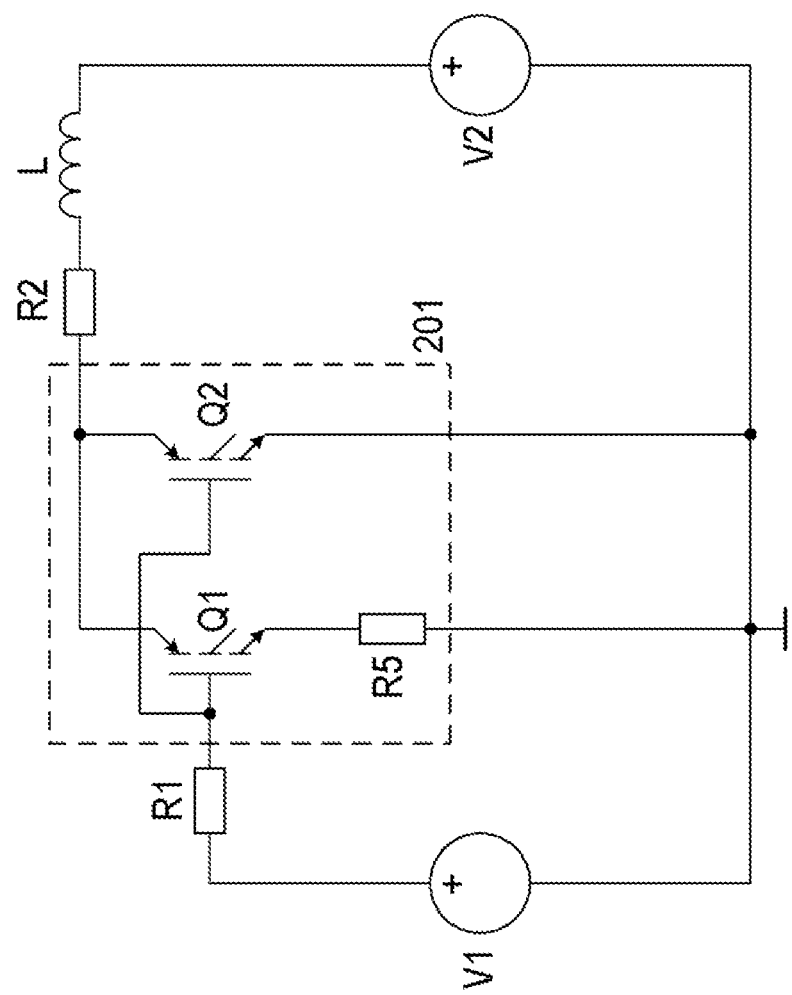
FIG. 2 shows an exemplary circuit diagram based on FIG. 1, wherein—in contrast to FIG. 1—a resistor with a negative temperature coefficient is used.

FIG. 2 shows an exemplary circuit diagram based on FIG. 1. In contrast to the unit 101 of FIG. 1, a unit 201 comprises a resistor R5 with a negative temperature coefficient. Also, in contrast to FIG. 1, no resistor R4 is required in series to the resistor R5. The current may be sensed between the emitter of the IGBT Q1 and the resistor R5 via an optional emitter pad (not shown in FIG. 2).

Hence, the IGBT Q1 builds the sense cell, which is integrated in series with the resistor R5. The IGBT Q1 and the resistor R5 may be part of the main IGBT Q2 (all integrated in the unit 201). The temperature compensated current sense voltage may be determined across the resistor R5.

For example, the resistor R5 may comprise, e.g., doped poly-silicon.

As an alternative, the additional element with negative temperature coefficient may comprise at least one diode (forward voltage Vf decreasing with an increasing temperature). This at least one diode can be arranged in series with a resistor, e.g., an external resistor, wherein a voltage across the diode and the resistor is sensed for current sensing purposes.

Further Embodiments and Advantages

The examples suggested herein may in particular be based on at least one of the following solutions. In particular combinations of the following features could be utilized in order to reach a desired result. The features of the method could be combined with any feature(s) of the device, apparatus or system or vice versa.

A circuit is provided, said circuit comprising
an electronic switching element,
a temperature compensating element, which is arranged in the vicinity of the electronic switching element.

The electronic switching element can be any transistor, e.g., MOSFET, JFET or IGBT. The electronic switching element may comprise at least one transistor. The temperature compensating element may comprise at least one element and it may be arranged to at least partially (or fully) compensate variations in current or voltage sensing that are based on changes in temperature. This may in particular apply to a predetermined range of temperature. It is noted that the temperature compensating element may in particular mitigate the effects that are based on temperature changes, but does not have to fully compensate such effects.

In an embodiment, the temperature compensating element is embedded in the electronic switching element.

In an embodiment, the temperature compensating element is connected in series in a current path of the electronic switching element.

The current path may be a path comprising the collector and emitter of an IGBT or source and drain of a MOSFET.

In an embodiment, the electronic switching element comprises at least one transistor, in particular at least one IGBT and/or at least one MOSFET.

The examples described herein may in particular be applicable for discrete MOSFETs or IGBTs, which may have a split emitter pad (in case of the IGBT) or a split source pad (in case of the MOSFET).

In an embodiment, the temperature compensating element comprises a resistor and/or a resistive element.

The temperature compensating element may in particular comprise several resistive elements (or resistors), in particular a network of resistive elements.

In an embodiment, the temperature compensating element has a positive temperature coefficient.

In an embodiment, the temperature compensating element and the electronic switching element are connected in series with an additional resistor, wherein a sense current is accessible between the temperature compensating element and the additional resistor.

In an embodiment, the temperature compensating element has a negative temperature coefficient.

In an embodiment, the temperature compensating element comprises at least one diode with a negative temperature coefficient.

It is noted that a forward voltage (VF) of the diode may decrease with an increase of temperature, which corresponds to a negative temperature coefficient.

In an embodiment, the at least one diode is connected in series with at least one additional resistor, wherein a sense current is accessible across the series connection comprising the at least one diode and the at least one additional resistor.

In an embodiment, the temperature compensating element comprises at least one of the following:
nickel;
aluminum;
doped poly-silicon;
beryllium (100% over 100K);
titanium;
titanium-nitride;
tungsten;
titanium-tungsten;
tantalum;
tantalum-nitride;
copper.

Also, the temperature compensating element may comprise combinations of these elements.

In an embodiment, the electronic switching element comprises at least two transistors.

In an embodiment, the electronic switching element comprises at least two transistors sharing a common functional unit.

In an embodiment,
the electronic switching element comprises a first transistor and a second transistor,
the first transistor and the second transistor are located on the same chip,
the first transistor and the second transistor are connected in parallel such that the first transistor carries a current that is proportional to the current carried by the second transistor,
the temperature compensating element is connected in series in a current path of the first transistor.

In an embodiment,
the electronic switching element comprises a first transistor and a second transistor,
the first transistor and the second transistor are located on the same substrate,
a functional unit of the first transistor is smaller than a functional unit of the second transistor,
the first transistor is connected in series with the temperature compensating element,
the gate of the first transistor is connected to the gate of the second transistor,
the collector of the first transistor is connected to the collector of the second transistor.

Hence, the first transistor may be regarded as current sense field, which allows the current sensed via the temperature compensating element to be significantly smaller than the current through a load. This efficiently reduces losses and increases the efficiency of the circuit.

In an embodiment, the first transistor and the second transistor share a functional unit, wherein the smaller portion of the functional unit is used for the first transistor.

This is exemplary for an IGBT type transistor. In case of a MOSFET or JFET, the collector corresponds to the drain and the emitter corresponds to the source.

In an embodiment, the circuit is arranged on a single chip or die, in particular part of an integrated circuit.

A method is provided for sensing a current or a voltage comprising the steps:
determining whether the voltage or the current reaches or exceeds a predetermined threshold via the circuit according to claim 1;
conducting a predetermined action in case the voltage or current reached or exceeded the predetermined threshold.

In an embodiment, the predetermined action comprises at least one of the following:
interrupting a current;
controlling the current or the voltage;
setting an error flag;
providing a signal to a processing device, a microcontroller or a processor;
turning off at least one transistor.

The solution presented may in particular be used for short circuit detection, overload protection and/or current mode control applications.

A circuit for voltage or current sensing is provided, said circuit comprising:
an electronic switching element and an temperature compensating element, which is arranged in the vicinity of the electronic switching element, means for determining whether the voltage or the current reaches or exceeds a predetermined threshold based on a voltage or current sensed via the temperature compensating element, means for conducting a predetermined action in case the voltage or current reached or exceeded the predetermined threshold.

Although various exemplary embodiments of this disclosure have been disclosed, it will be apparent to those skilled in the art that various changes and modifications can be made which will achieve some of the advantages of this disclosure without departing from the spirit and scope of this disclosure. It will be obvious to those reasonably skilled in the art that other components performing the same functions may be suitably substituted. It should be mentioned that features explained with reference to a specific figure may be combined with features of other figures, even in those cases in which this has not explicitly been mentioned. Further, the methods described in this disclosure may be achieved in either all software implementations, using the appropriate processor instructions, or in hybrid implementations that utilize a combination of hardware logic and software logic to achieve the same results. Such modifications to the inventive concept are intended to be covered by the appended claims.

The invention claimed is:

1. A circuit comprising:
an electronic switching element, and
a temperature compensating element configured to compensate or at least reduce a temperature dependency of the electronic switching element,
wherein the temperature compensating element is arranged in the vicinity of the electronic switching element,
wherein the electronic switching element comprises a first transistor and a second transistor,
wherein the first transistor and the second transistor are located on the same substrate,
wherein a functional unit of the first transistor is smaller than a functional unit of the second transistor,
wherein the first transistor is connected in series with the temperature compensating element,
wherein the gate of the first transistor is connected to the gate of the second transistor, and
wherein the collector of the first transistor is connected to the collector of the second transistor.

2. The circuit according to claim 1, wherein the temperature compensating element is embedded in the electronic switching element.

3. The circuit according to claim 1, wherein the temperature compensating element is connected in series in a current path of the electronic switching element.

4. The circuit according to claim 1, wherein the electronic switching element comprises at least one IGBT and/or at least one MOSFET.

5. The circuit according to claim 1, wherein the temperature compensating element comprises a resistor and/or a resistive element.

6. The circuit according to claim 1, wherein the temperature compensating element has a positive temperature coefficient.

7. The circuit according to claim 6, wherein the temperature compensating element and the electronic switching element are connected in series with an additional resistor, wherein a sense current is accessible between the temperature compensating element and the additional resistor.

8. The circuit according to claim 1, wherein the temperature compensating element has a negative temperature coefficient.

9. The circuit according to claim 8, wherein the temperature compensating element comprises at least one diode with a negative temperature coefficient.

10. The circuit according to claim 9, wherein the at least one diode is connected in series with at least one additional resistor, wherein a sense current is accessible across the series connection comprising the at least one diode and the at least one additional resistor.

11. The circuit according to claim 1, wherein the temperature compensating element comprises at least one of the following:
nickel;
aluminum;
doped poly-silicon;
beryllium (100% over 100K);
titanium;
titanium-nitride;
tungsten;
titanium-tungsten;
tantalum;
tantalum-nitride; and
copper.

12. The circuit according to claim 1, wherein the first transistor and the second transistor comprise discrete transistors.

13. The circuit according to claim 1, wherein the electronic switching element comprises the first transistor and the second transistor comprise discrete transistors sharing a common functional unit.

14. The circuit according to claim 1,
wherein the first transistor and the second transistor are located on the same chip,
wherein the first transistor and the second transistor are connected in parallel such that the first transistor carries a current that is proportional to the current carried by the second transistor, and
wherein the temperature compensating element is connected in series in a current path of the first transistor.

15. The circuit according to claim 1, wherein the circuit is arranged on a single chip or die, in particular part of an integrated circuit.

16. The circuit according to claim 1, wherein the first transistor and the second transistor share a common functional unit wherein the smaller portion of the common functional unit is used for the first transistor.

17. A circuit for voltage or current sensing comprising:
an electronic switching element and a temperature compensating element, wherein the temperature compensating element is arranged in the vicinity of the electronic switching element,
wherein the electronic switching element comprises a first transistor and a second transistor,
wherein the first transistor and the second transistor are located on the same substrate,
wherein a functional unit of the first transistor is smaller than a functional unit of the second transistor,
wherein the first transistor is connected in series with the temperature compensating element,
wherein the gate of the first transistor is connected to the gate of the second transistor, and
wherein the collector of the first transistor is connected to the collector of the second transistor, means for determining whether a voltage or a current reaches or exceeds a predetermined threshold based on a sensed voltage or sensed current sensed via the temperature compensating element, and means for conducting a predetermined action in case the voltage or the current reached or exceeded the predetermined threshold.

18. A method for sensing a current or a voltage in a circuit comprising an electronic switching element, and a temperature compensating element, wherein the temperature compensating element is arranged in the vicinity of the electronic switching element, wherein the electronic switching element comprises a first transistor and a second transistor, wherein the first transistor and the second transistor are located on the same substrate, wherein a functional unit of the first transistor is smaller than a functional unit of the second transistor, wherein the first transistor is connected in series with the temperature compensating element, wherein the gate of the first transistor is connected to the gate of the second transistor, and wherein the collector of the first transistor is connected to the collector of the second transistor, the method comprising:

determining whether the voltage or the current reaches or exceeds a predetermined threshold via the circuit; and conducting a predetermined action in case the voltage or current reached or exceeded the predetermined threshold.

19. The method according to claim 18, wherein the predetermined action comprises at least one of the following:

interrupting a current;
controlling the current or the voltage;
setting an error flag;
providing a signal to a processing device, a microcontroller or a processor; and
turning off at least one transistor.

* * * * *